(12) United States Patent
Tatenuma et al.

(10) Patent No.: US 9,983,274 B2
(45) Date of Patent: May 29, 2018

(54) MAGNETIC DETECTION DEVICE

(71) Applicant: Mitsubishi Electric Corporation, Tokyo (JP)

(72) Inventors: Yoshinori Tatenuma, Tokyo (JP); Junichi Ichikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days. days.

(21) Appl. No.: 14/915,476

(22) PCT Filed: Jan. 23, 2014

(86) PCT No.: PCT/JP2014/051322
§ 371 (c)(1),
(2) Date: Feb. 29, 2016

(87) PCT Pub. No.: WO2015/111163
PCT Pub. Date: Jul. 30, 2015

(65) Prior Publication Data
US 2016/0223625 A1    Aug. 4, 2016

(51) Int. Cl.
*G01R 33/09* (2006.01)
*G01R 33/00* (2006.01)

(52) U.S. Cl.
CPC ....... *G01R 33/098* (2013.01); *G01R 33/0029* (2013.01)

(58) Field of Classification Search
CPC ............ G01R 33/0023; G01R 33/0029; G01R 33/0035; G01R 33/02; G01R 33/06–33/098; G01D 5/12–5/242
See application file for complete search history.

(56) References Cited

U.S. PATENT DOCUMENTS 5,351,005 A * 9/1994 Rouse ............... G01R 17/10
324/207.21
5,561,368 A 10/1996 Dovek et al.
(Continued)

FOREIGN PATENT DOCUMENTS

JP    60-70078 U    5/1985
JP    1-128107 U    9/1989
(Continued)

OTHER PUBLICATIONS

H. Jaffres et al., "Angular dependence of the tunnel magnetoresistance in transition-metal-based junctions", Physical Review, B, Jul. 24, 2001, vol. 64, 064427.
(Continued)

*Primary Examiner* — Huy Q Phan
*Assistant Examiner* — David Frederiksen
(74) *Attorney, Agent, or Firm* — Sughrue Mion, PLLC; Richard C. Turner

(57) ABSTRACT

A magnetic detection in which a first element (3) and a second element (4) that are a magnetoresistance element whose resistance value changes in response to an external magnetic field are connected in series with each other so as to form a bridge circuit, one end of the bridge circuit is connected to a power supply (5), the other end thereof is grounded, a connecting point (6) between the first element (3) and the second element (4) is connected to an amplifier means (9), at least one switching means (1) is connected in series with the bridge circuit, and an output terminal (11) of the amplifier means (9) is connected to a failure detection means (12).

12 Claims, 10 Drawing Sheets

(56) References Cited

U.S. PATENT DOCUMENTS

| | | | |
|---|---|---|---|
| 6,343,498 B1 | 2/2002 | Oba et al. | |
| 6,433,545 B1 * | 8/2002 | Kunze | G01R 33/09 324/207.21 |
| 7,262,594 B1 * | 8/2007 | Tomino | G01D 3/08 324/207.21 |
| 2003/0218840 A1 * | 11/2003 | Apel | G01D 5/145 361/51 |
| 2008/0054896 A1 | 3/2008 | Kahlman | |
| 2011/0025318 A1 * | 2/2011 | Saruki | G01R 33/0023 324/252 |
| 2011/0025320 A1 | 2/2011 | Ohta et al. | |
| 2012/0095712 A1 * | 4/2012 | Komasaki | G01D 5/145 702/94 |
| 2012/0153936 A1 * | 6/2012 | Romani | G01R 33/0035 324/202 |
| 2012/0263985 A1 * | 10/2012 | Murata | G01R 15/207 429/90 |
| 2015/0061559 A1 * | 3/2015 | Nakamura | H02P 6/12 318/400.38 |
| 2015/0108971 A1 * | 4/2015 | Granig | G01R 33/091 324/252 |

FOREIGN PATENT DOCUMENTS

| | | | |
|---|---|---|---|
| JP | 10-293040 A | | 11/1998 |
| JP | 3017061 B2 | | 3/2000 |
| JP | 2001-194256 A | | 7/2001 |
| JP | 2001194256 A | * | 7/2001 |
| JP | 2004-191189 A | | 7/2004 |
| JP | 2004191189 A | * | 7/2004 |
| JP | 2005-156193 A | | 6/2005 |
| JP | 2007-114132 A | | 5/2007 |
| JP | 2008-522146 A | | 6/2008 |
| JP | 2011-47928 A | | 3/2011 |
| JP | 2013-108887 A | | 6/2013 |
| JP | 2013108887 A | * | 6/2013 |

OTHER PUBLICATIONS

International Search Report of PCT/JP2014/051322 dated Apr. 8, 2014.

Communication dated Aug. 1, 2017, from the Japanese Patent Office in counterpart application No. 2016-212478, 11 pages with translation.

* cited by examiner

EXTERNAL MAGNETIC FIELD DIRECTION APPLIED TO TMR

MAGNETIC DETECTION DEVICE

CROSS REFERENCE TO RELATED APPLICATIONS

This application is a National Stage of International Application No. PCT/JP2014/051322 filed Jan. 23, 2014, the contents of all of which are incorporated herein by reference in their entirety.

TECHNICAL FIELD

The present invention relates to magnetic detection devices that use magnetoresistance elements and detect rotation of an object to be detected by change in magnetic field.

BACKGROUND ART

There is a method in which electrodes are formed at both ends of a magnetoresistance element that is an electromagnetic conversion element so as to form a Wheatstone bridge circuit, a constant-voltage power supply is connected between two opposing electrodes of this Wheatstone bridge circuit, and change in the resistance value of the magnetoresistance element is converted into voltage change, thereby detecting change in the magnetic field acting on the magnetoresistance element (see, for example, Patent document 1).

The magnetoresistance element here is, as shown in FIG. 7, provided with a laminate including a magnetization free layer 113 whose magnetization direction changes in response to an external magnetic field, a magnetization fixed layer 111 whose magnetization direction is fixed with respect to the external magnetic field, and a non-magnetic intermediate layer 112 that is sandwiched between the magnetization fixed layer 111 and the magnetization free layer 113. The magnetization of the magnetization free layer 113 freely rotates in response to the external magnetic field within a film plane of the laminate. Hereinafter, explanations will be made here with the magnetoresistance element exemplified by a tunnel magnetoresistance (hereinafter referred to as TMR) element whose non-magnetic intermediate layer 112 is made of an insulator.

The electric characteristics of the TMR element are generally known to be expressed in the form of a conductance G. (See Equation (2) and Column V: CONCLUSION, Non-patent document 1.)

That is, letting a relative angle of the magnetization direction of the magnetization free layer 113 with respect to that of the magnetization fixed layer 111 be $\theta$, the conductance G can be expressed as below. Here, the magnetization direction of the magnetization free layer 113 becomes the same as the direction of the external magnetic field, that is, the rotation angle $\theta$ of the magnetic field.

$$G = G0 + G1 \cos \theta. \quad (1)$$

If this is expressed in the form of a resistance value, it becomes the inverse number of Equation (1) as follows:

$$R = 1/(G0 + G1 \cos \theta). \quad (2)$$

FIG. 8 shows how the conductance G changes in response to the direction of the magnetic field applied to the TMR element from outside. In FIG. 8, the horizontal axis represents the rotation angle of the magnetic field, and the vertical axis represents the conductance G.

A conventional technology will be explained here, in which a half bridge (hereinafter referred to a bridge) is configured, as shown in FIG. 9, with TMR element connection bodies 116 and 117 each using eight TMR elements connected with each other, this bridge is disposed in front of a magnet body 114 that is alternately magnetized to N poles and S poles, and a voltage at the midpoint of the bridge is applied to an amplifier 119.

In FIG. 9, when the magnet body 114 moves in the left direction on this paper, magnetization directions of the magnetization fixed layers of all the TMR elements are those indicated by arrows 118. The direction 115 of the external magnetic field changes as shown in FIG. 8 depending on the position; therefore, the conductance G of the TMR element connection bodies 116 and 117 changes in the form of a cosine wave.

Here, the conductance G of TMR element connection body 116 and that of the TMR element connection body 117 are out of phase with each other by 180°. At this moment, the voltage at the midpoint of the bridge, which is a connecting point between the TMR element connection body 116 and the TMR element connection body 117, can be calculated using above-described Equation (2), which is given by the following Equation (3).

$$(G0 + G1 \cos \theta)/2G0. \quad (3)$$

Change in the voltage at the midpoint becomes in the form of a cosine wave, and an output waveform at an output terminal 120 becomes a cosine wave as shown by a curve 121, with the voltage at the midpoint inversely amplified by an amplifier 119. In this way, the change in the magnetic field is converted into voltage change, and thereby the movement of the magnet body, which is an object to be detected, can be detected.

There have been proposed various types of failure detection means in general-use sensing devices. For example, there is a device that detects change in voltage by applying a constant current to the midpoint of a bridge. (See, for example, Patent document 2.)

Moreover, there is another device in which switches are provided in parts of a bridge so as to monitor the resistance of the bridge by changing over those switches. (See, for example, Patent document 3.)

PRIOR ART DOCUMENT

Patent Documents

Patent document 1: Japanese Patent Registration No. 3017061
Patent document 2: Japanese Laid-open Patent Publication No. 2007-114132
Patent document 3: Japanese Laid-open Patent Publication No. 2005-156193

Non-Patent Document

Non-patent document 1: Angular Dependence of the Tunnel Magnetoresistance in Transition-metal-based Junctions. Physical Review B Vol. 64, 064427 (2001)

SUMMARY OF THE INVENTION

Problems to be Solved by the Invention

As described above, the non-magnetic intermediate layer 112 of the TMR element is made of an oxide film. Since the oxide film only has such a thickness as to cause a tunnel effect (a few nano-meters), it is concerned that the oxide film might be broken down by any electrical factor or any physical factor due to foreign substances. The breakdown of the oxide film means that the resistance of the TMR element becomes low (or shortcircuited).

FIG. 10 shows a case in which a connecting unit 122 of one TMR element out of sixteen TMR elements connected with each other fails. The failure in this case means its resistance becomes low (or shortcircuited). Assume that a magnetic field in the same direction is applied to TMR element connection bodies 116 and 117. In this case, an output waveform 123 is deviated toward the higher voltage side, compared with the normal output waveform 124. Therefore, the failure can be detected using a deviation from a predetermined voltage.

However, when two connecting units 125 of one TMR element out of the sixteen TMR elements connected with each other fail as shown in FIG. 11, an output waveform 126 completely overlaps a predetermined voltage 127, and as a result, the failure cannot be detected by monitoring the output waveform. Similarly, when the same number of connecting units thereof fails in the connection bodies in the higher and lower voltage sides with respect to the midpoint of the bridge, a problem has been that the failure of the TMR elements cannot be detected.

Moreover, failure sometimes cannot be detected by the method of Patent document 2, depending on how many connecting units of one TMR element fail. FIG. 12 shows for reference a configuration in which failure cannot be detected.

In FIG. 12, letting, for example, the resistance value of a connecting unit of one TMR element be 2 kΩ and a measured voltage in the normal state be 1.8 V, the measured voltage also becomes 1.8 V even if six connecting units thereof and two connecting units thereof fail (shortcircuited) in the higher voltage side and the lower voltage side with respect to the midpoint voltage, respectively; therefore, the failure sometimes cannot be detected.

In the device of Patent document 3, failure of all of the resistance values of the bridge can be detected; however, switches are required for each side of the bridge. For example, when a plurality of Wheatstone bridges is provided, the circuit becomes complicated, thereby making production and control of the device very difficult.

The present invention has been made to resolve the problem described above, and provide a magnetic detection device in which failure of the TMR element resistance becoming low (up to shortcircuited) or high (up to disconnected) can be certainly detected through a simpler configuration.

Means for Solving the Problems

A magnetic detection device according to the present invention is configured in such a way that a first element and a second element that are a magnetoresistance element whose resistance value changes in response to an external magnetic field are connected in series with each other so as to form a bridge circuit, one end of the bridge circuit is connected to a power supply, the other end of the bridge circuit is grounded, a connecting point between the first element and the second element is connected to an amplifier means, at least one switching means is connected in series with the bridge circuit, and one end of the output of the amplifier means is connected to a failure detection means.

Effect of the Invention

According to the present invention, a magnetic detection device can be obtained, which can certainly determine failure of magnetoresistance elements through a simpler configuration with a small number of switches or without any switch.

The foregoing and other objects, features and advantages of the present invention will become more apparent from the detailed explanation and description in conjunction with the accompanying drawings in the following embodiments.

MODES FOR CARRYING OUT THE INVENTION

Figure 1:
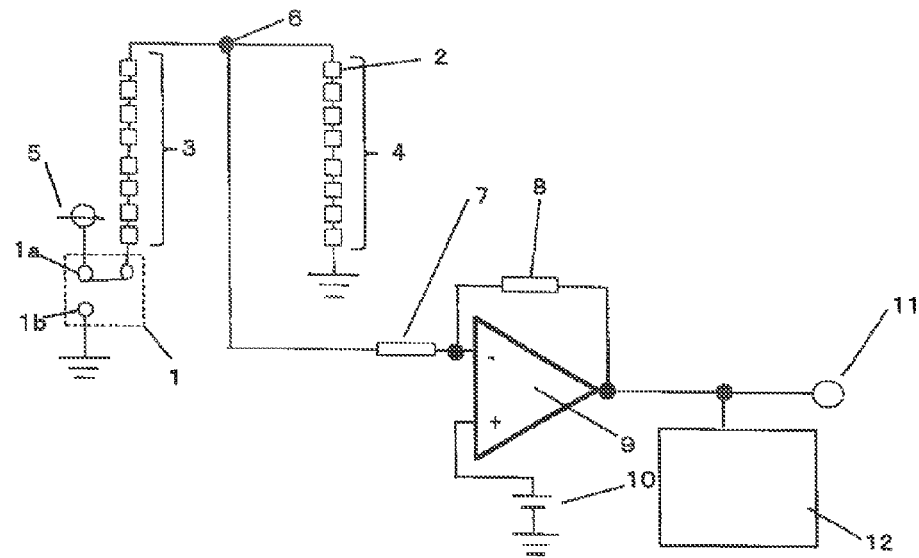
FIG. 1 is a circuit configuration diagram of a magnetic detection device according to Embodiment 1 of the present invention.

Hereinafter, the embodiments of the magnetic detection devices according to the present invention will be explained referring to the accompanying drawings.

Additionally, the same reference numerals represent the same or corresponding parts in each drawing.

Embodiment 1

FIG. 1 is a circuit configuration diagram showing a magnetic detection device according to Embodiment 1 of the present invention.

In FIG. 1, the reference numeral 2 represents a connecting unit of one TMR element; TMR element connection bodies 3 and 4 each include eight connecting units thereof connected as one set and constitute a bridge. One end of the TMR element connection body 3 is connected to a power supply 5 via a switch 1. Moreover, one end of the TMR element connection body 4 is grounded. The midpoint 6 of the bridge constituted of the TMR element connection bodies 3 and 4 is connected to a resister 7. The resister 7 and a resister 8 are resisters serving for determining the amplification factor of an operational amplifier 9 (hereinafter, also referred to as an amplifier). The positive side of the operational amplifier 9 is connected to a reference power supply 10. One end of the output of the operational amplifier 9 is connected to a failure detector 12.

Figure 9:
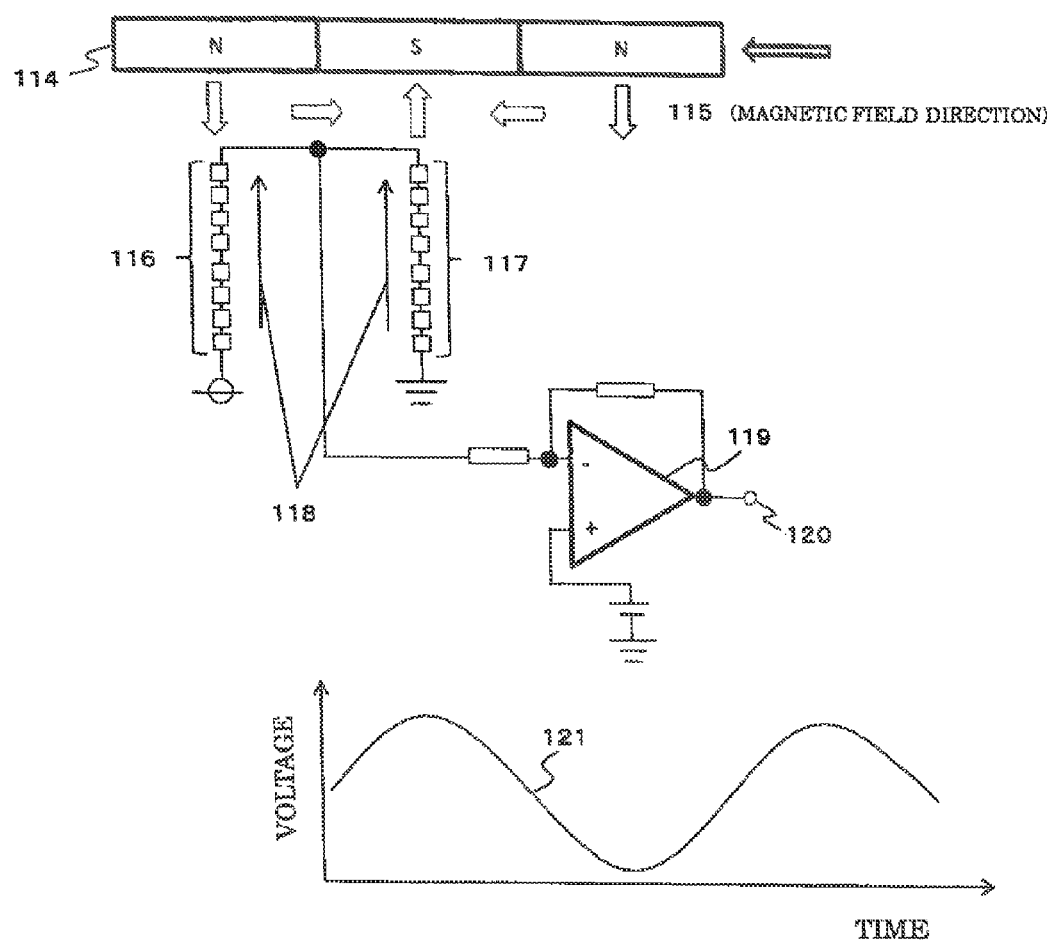
FIG. 9 is a schematic diagram showing the configuration and operation of a conventional magnetic detection device.
Figure 10:
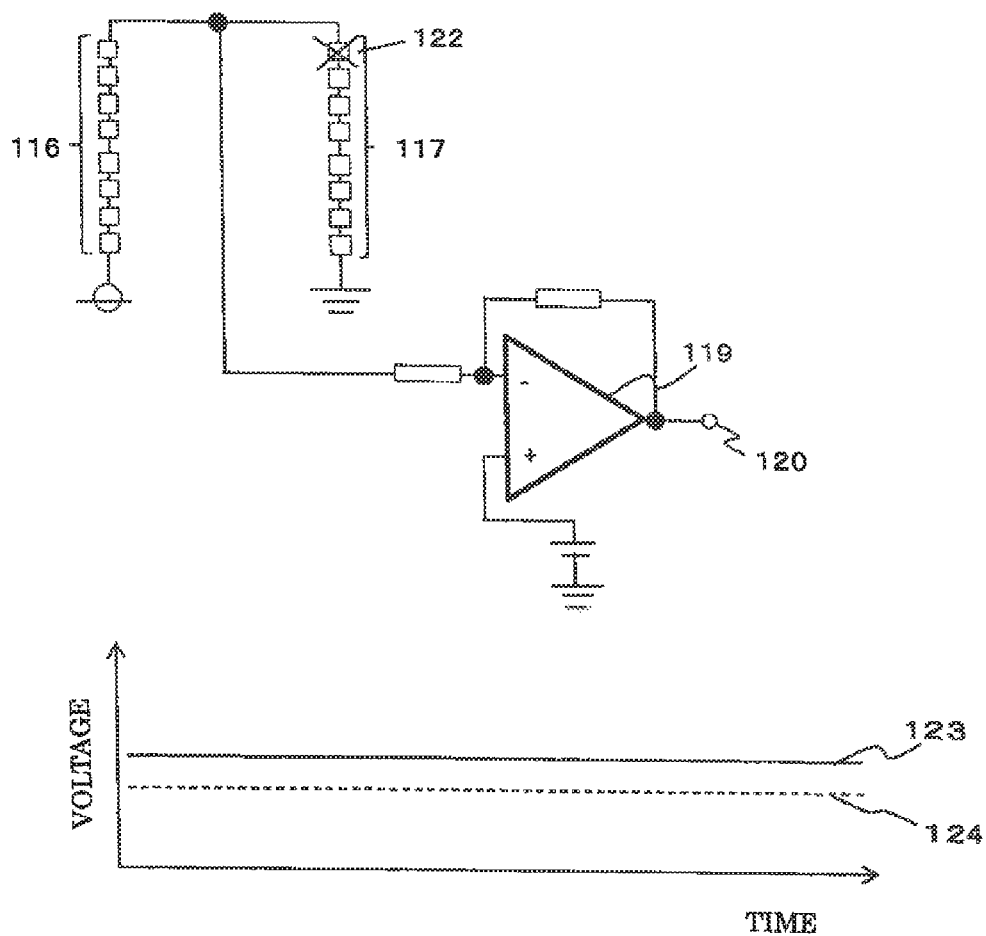
FIG. 10 is a schematic diagram showing operation of the conventional magnetic detection device in failure.
Figure 11:
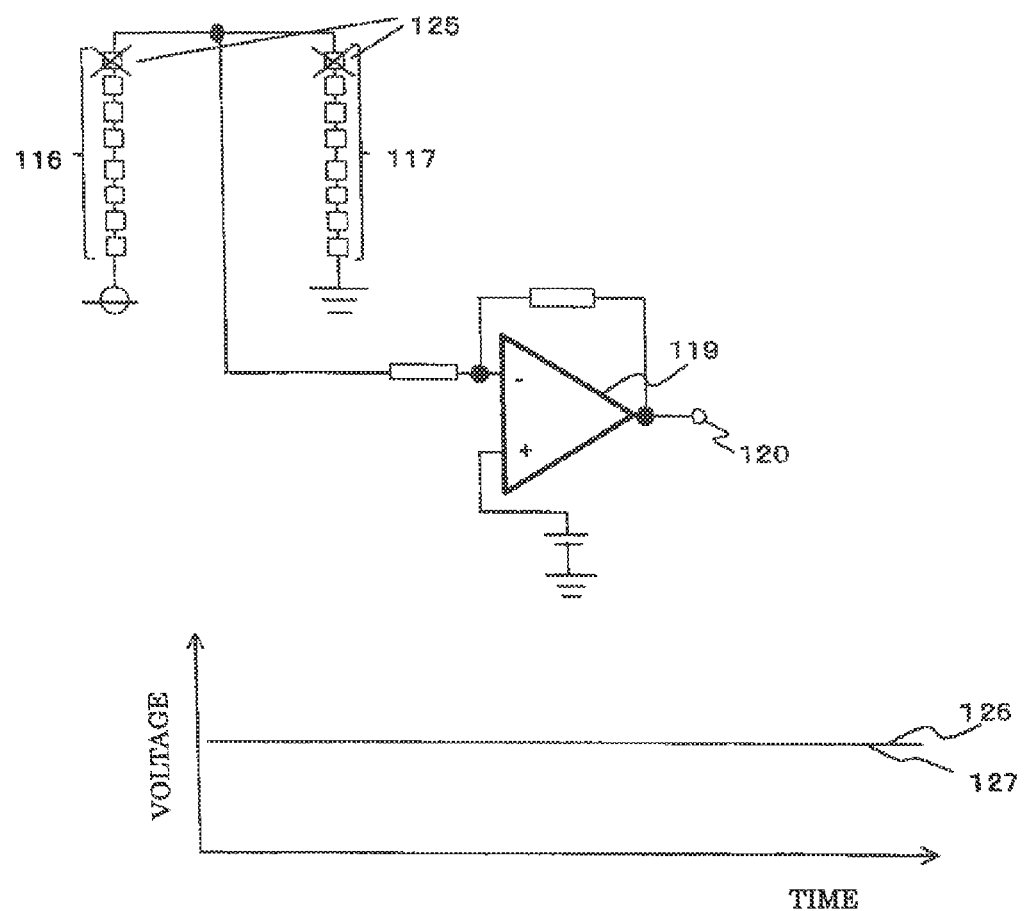
FIG. 11 is another schematic diagram showing operation of the conventional magnetic detection device in failure.
Figure 12:
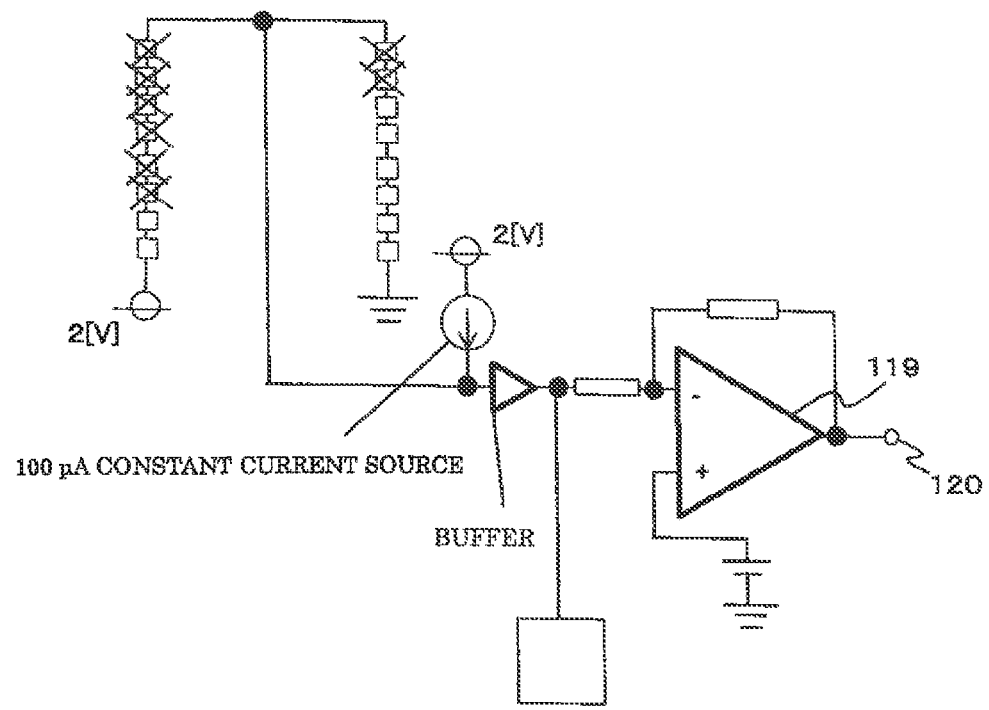
FIG. 12 is still another schematic diagram showing operation of the conventional magnetic detection device in failure.

When the switch 1 is connected to the power supply side contact 1a, this magnetic detection device has the same circuit configuration as that in FIG. 9 described above; as explained in the conventional technology, a waveform at the output terminal 11 becomes in the form of a cosine wave in response to the movement of a magnet body 14, which is the same as the output waveform in FIG. 9; therefore, the movement of the magnet body 14, which is an object to be detected, can be detected.

In order to detect failure of the TMR elements, the switch 1 is connected to the ground side contact 1b here. At this moment, assume that a magnetic field in the same direction is applied to the TMR element connection bodies 3 and 4. This is because the TMR element connection bodies 3 and 4 are made to show nearly the same resistance value. Since the positive and negative electrodes of the operational amplifier 9 are imaginary shortcircuited with each other, the voltage of the reference power supply 10 at the positive electrode comes into a state of being applied to the series circuit of the resister 7 and the combined resister of the TMR element connection bodies 3 and 4. A current flowing through the series circuit of the resister and the combined resister of the TMR element connection bodies 3 and 4 is converted into a voltage by the resister 8, and the resultant voltage is output to the output terminal 11. This is a general-use current-voltage converter circuit. Assuming here that the resistance value of the resister 7 and that of the resister 8 are each set to an arbitrary value, a voltage at the output terminal 11 changes depending on the resistance value of the TMR element connection body 3 or that of the TMR element connection body 4; therefore, the failure can be detected by measuring this voltage by the failure detector 12.

The voltage at the output terminal 11 will be calculated using specific numerical values.

Letting the resistance value of the connecting unit 2 of one TMR element be 2 kΩ, the number of connecting units thereof included in each of the TMR element connection bodies 3 and 4 be eight, the resistance value of the resister 7 be 1 kΩ, the resistance value of the resister 8 be 10 kΩ, and the voltage of the reference power supply 10 be 1 V, the voltage at the output terminal 11 becomes 2.11 V.

Here, if any one of the connecting units of one TMR element fails in each of the TMR element connection bodies 3 and 4, the voltage at the output terminal 11 becomes 2.25 V. Since the voltage at the output terminal 11 changes in this way when failure occurs, the failure of the TMR elements can be detected by detecting change in the voltage at the output terminal 11.

As described above, a magnetic detection device according to Embodiment 1 of the present invention is provided with a switch, and the current value flowing through the magnetoresistance elements is converted into a voltage using an amplifier; therefore, even if the same number of connecting units fails in each of the TMR element connection bodies 3 and 4, the failure can be detected.

Embodiment 2

Figure 2:
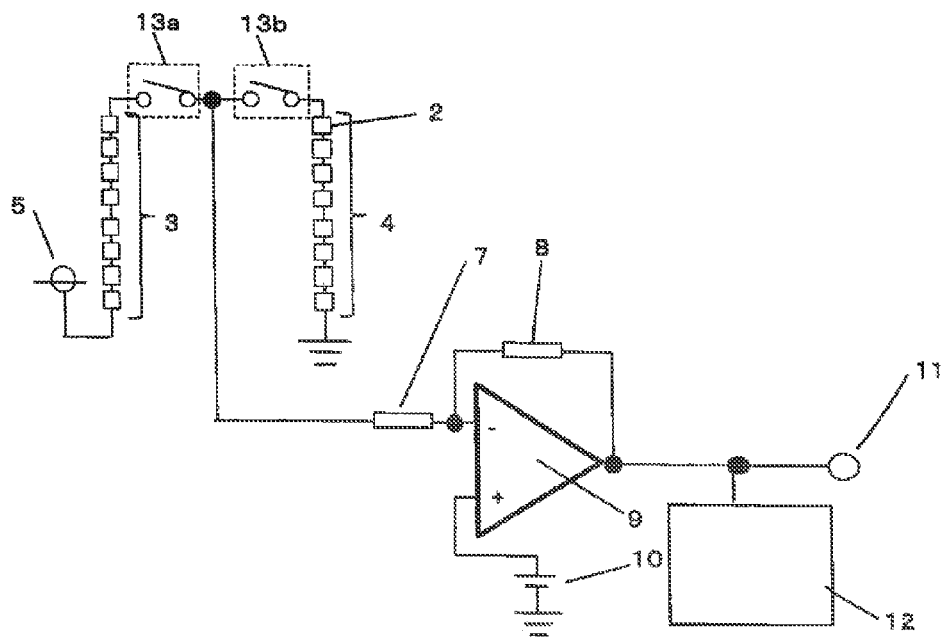
FIG. 2 is a circuit configuration diagram of a magnetic detection device according to Embodiment 2 of the present invention.

FIG. 2 is a circuit configuration diagram showing a magnetic detection device according to Embodiment 2 of the present invention.

In the figure, the reference numerals 13a and 13b each represent a switch. Other configuration except the switch 1 of Embodiment 1 in FIG. 1 is the same as that in FIG. 1.

When the switches 13a and 13b are in the ON state, this magnetic detection device has the same circuit configuration as that in FIG. 9; as explained in the conventional technology, the waveform at the output terminal 11 becomes in the form of a cosine wave in response to the movement of the magnet body, which is the same as the output waveform in FIG. 9; therefore, the movement of the magnet body, which is an object to be detected, can be detected.

In order to detect failure of the TMR elements, the switch 13a is turned off here. At this moment, assume that a magnetic field in the same direction is applied to the TMR element connection bodies 3 and 4. Since the positive and negative electrodes of the operational amplifier 9 are imaginary shortcircuited with each other, the voltage of the reference power supply 10 at the positive electrode comes into a state of being applied to the series circuit of the resister 7 and the TMR element connection body 4.

A current flowing through the series circuit of the resister 7 and the TMR element connection body 4 is converted into a voltage by the resister 8 and the resultant voltage is output to the output terminal 11.

Next, the switch 13a is turned on and the switch 13b is turned off. Since the positive and negative electrodes of the operational amplifier 9 are imaginary shortcircuited with each other, the difference between the voltage of the power supply 5 and that of the reference power supply 10 comes into a state of being applied to the series circuit of the TMR element connection body 3 and the resister 7. A current flowing through the series circuit of the resister 7 and the TMR element connection body 3 is converted into a voltage by the resister 8, and the resultant voltage is output to the output terminal 11. Assuming here that the resistance value of the resister 7 and that of the resister 8 are each set to an arbitrary value, the voltage at the output terminal 11 changes depending on the resistance value of the TMR element connection body 3 or that of the TMR element connection body 4; therefore, failure detection becomes possible.

The voltage at the output terminal 11 will be calculated using specific numerical values. Let the resistance value of the connecting unit 2 of one TMR element be 2 kΩ, the number of connecting units thereof included in each of the TMR element connection bodies 3 and 4 be eight, the resistance value of the resister 7 be 1 kΩ, the resistance value of the resister 8 be 10 kΩ, the voltage of the reference power supply 10 be 1 V, and the voltage of the power supply 5 be 2 V. When the switch 13a is turned off (meanwhile, the switch 13b is turned on), the voltage at the output terminal 11 becomes 1.59 V.

When the switch 13b is turned off (meanwhile, the switch 13a is turned on), the voltage at the output terminal 11 becomes 0.41 V. If any one of the connecting units of one TMR element fails here in each of the TMR element connection bodies 3 and 4, when the switch 13a is turned off, the voltage at the output terminal 11 becomes 1.67 V, whereas 0.33 V when the switch 13b is turned off.

Since the voltage at the output terminal 11 changes in this way when failure occurs, the failure can be detected by measuring this voltage change by the failure detector 12.

As described above, a magnetic detection device according to Embodiment 2 of the present invention is provided with two switches and the current value flowing through the magnetoresistance elements is converted into a voltage using an amplifier, whereby even if the same number of connecting units fails in each of the TMR element connection bodies 3 and 4, the failure can be detected.

Embodiment 3

Figure 3:
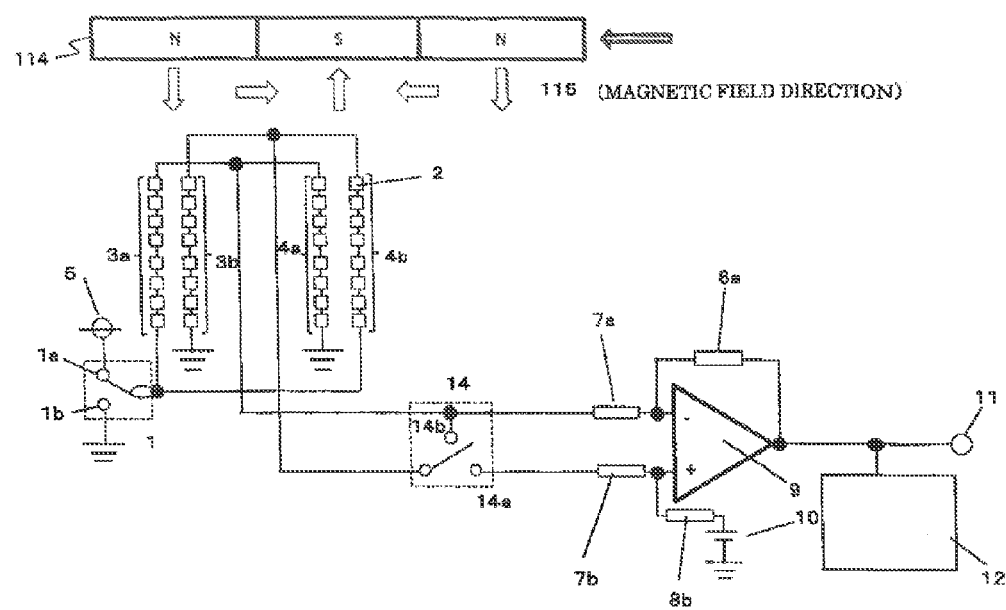
FIG. 3 is a circuit configuration diagram of a magnetic detection device according to Embodiment 3 of the present invention.

FIG. 3 is a circuit configuration diagram showing a magnetic detection device according to Embodiment 3 of the present invention.

In Embodiment 3 of the present invention, magnetoresistance elements are configured in the form of what is called a Wheatstone bridge, and the configuration is almost the same as that of Embodiment 1 except that a switch 14 is additionally provided to it. When the switch 1 is connected to the power supply side contact 1a and the switch 14 is connected to the contact 14a side in FIG. 3, the waveform at the output terminal 11, as explained in the conventional technology, becomes in the form of a cosine wave in response to the movement of the magnet body, which is the same as the output waveform in FIG. 9; therefore, the movement of the magnet body 113, which is an object to be detected, can be detected. Additionally, the magnetoresistance elements are configured in the form of the Wheatstone bridge in Embodiment 3, change in voltage at a connecting point between the TMR element connection bodies 3a and 4a is phase-shifted by 180° from that at a connecting point between the TMR element connection bodies 3b and 4b; therefore, an output voltage twice as high as that in Embodiment 1 can be obtained at the output terminal 11.

In order to detect failure of the TMR elements, the switch 1 is connected to the ground-side contact 1b and the switch 14 is connected to 14b here. At this moment, assume that a magnetic field in the same direction is applied to TMR element connection bodies 3a, 3b, 4a and 4b. This is because the TMR element connection bodies 3a, 3b, 4a and 4b are made to show nearly the same resistance value. Since the positive and negative electrodes of the operational amplifier 9 are imaginary shortcircuited with each other, the voltage of the reference power supply 10 at the positive electrode comes into a state of being applied to a series circuit formed of a resister 7a and the combined resister of the TMR element connection bodies 3a, 3b, 4a and 4b.

A current flowing through the series circuit of the resister 7a and the combined resister of the TMR element connection bodies 3a, 3b, 4a and 4b is converted into a voltage by a resister 8a and the resultant voltage is output to the output terminal 11.

Assuming here that the resistance value of the resister 7a and that of the resister 8a are each set to an arbitrary value, the voltage at the output terminal 11 changes depending on the resistance values of the TMR element connection bodies 3a, 3b, 4a and 4b, thereby enabling the failure to be detected.

The voltage at the output terminal 11 will be calculated using specific numerical values. The switch 1 is connected to the ground side contact 1b; the switch, 14 is connected, to 14b. Letting the resistance value of the connecting unit 2 of one TMR element be 2 kΩ the number of connecting units thereof included in each of the TMR element connection bodies 3a, 3b, 4a and 4b be eight, the resistance value of the resister 7a be 1 kΩ, the resistance value of the resister 8a be 10 kΩ, and the voltage of the reference power supply 10 be 1 V, the voltage at the output terminal 11 becomes 3 V. If any one of the connecting units of one TMR element fails here in each of the TMR element connection bodies 3a and 4a, the voltage at the output terminal 11 becomes 3.11 V.

Since the voltage at the output terminal 11 changes in this way if failure occurs, the failure can be detected by measuring this voltage change by the failure detector 12.

As described above, a magnetic detection device according to Embodiment 3 of the present invention is provided with two switches, and the current value flowing through the magnetoresistance elements is converted into a voltage using an amplifier; therefore, even if the same number of connecting units fails in each of the TMR element connection bodies 3a and 4a, the failure can be detected.

Embodiment 4

Figure 4:
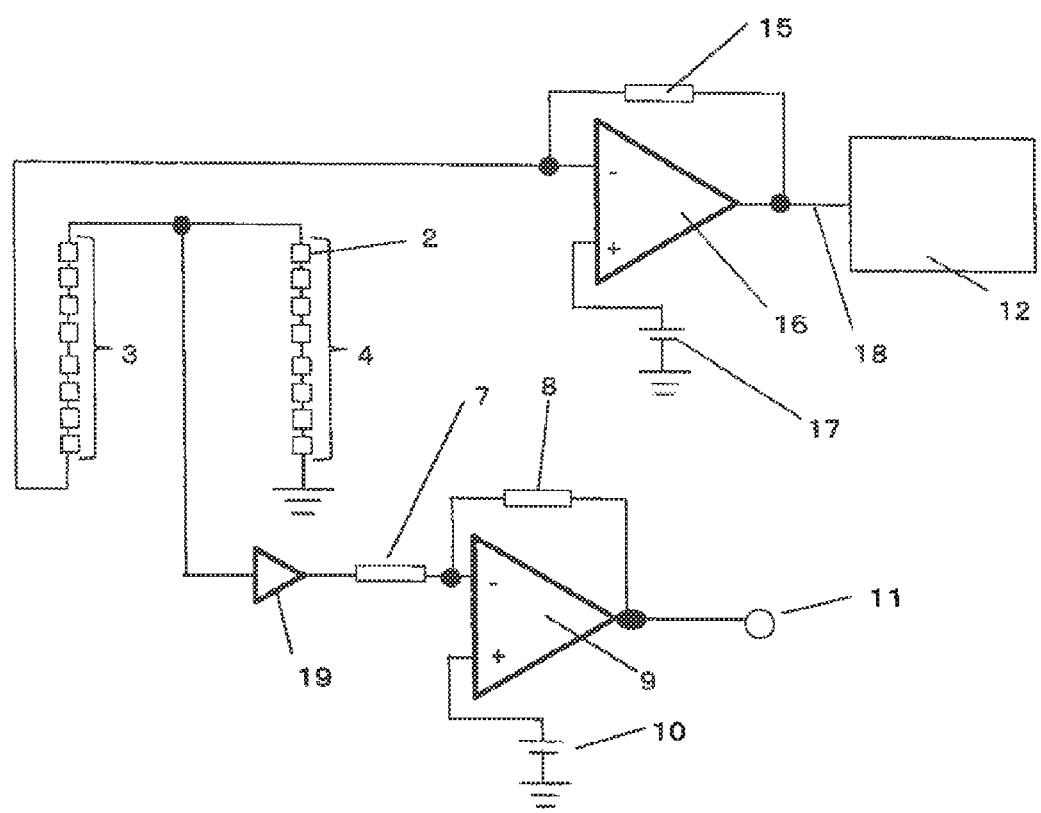
FIG. 4 is a circuit configuration diagram of a magnetic detection device according to Embodiment 4 of the present invention.

FIG. 4 is a circuit configuration diagram showing a magnetic detection device according to Embodiment 4 of the present invention.

In FIG. 4, the reference numeral 2 represents a connecting unit of one TMR element; the TMR element connection bodies 3 and 4 each including as one set eight connecting units thereof constitute a bridge. The reference numeral 19 represents a buffer; the resisters 7 and 8 are resistors that determine the amplification factor of the amplifier 9. The reference power supply 10 serves as a reference voltage at the output terminal 11 of the operational amplifier 9. Moreover, a resister 15, an operational amplifier 16 and a power supply 17 form a current-voltage converter circuit. The reference numeral 12 represents a failure detector.

In the current-voltage converter circuit formed of the resister 15, the operational amplifier 16 and the power supply 17, since the positive side and the negative side of the operational amplifier 16 are imaginary shortcircuited with each other, the voltage of the power supply 17 is applied to one end of the TMR element connection body 3. Therefore, as explained in the conventional technology, the waveform at the output terminal 11 becomes in the form of a cosine wave in response to the movement of the magnetic body, which is the same as the output waveform in FIG. 9, so the movement of the magnet body, which is an object to be detected, can be detected.

In order to detect failure of TMR elements, assume here that a magnetic field in the same direction is applied to the TMR element connection bodies 3 and 4. This is because the TMR element connection bodies 3 and 4 are made to show nearly the same resistance value. Since the buffer 19 is provided, a current flowing through the TMR element connection bodies 3 and 4 does not leak to the buffer 19 side. Therefore, the current flowing through the series resister circuit made up of the TMR element connection bodies 3 and 4 to which the voltage of the power supply 17 is applied is converted into a voltage by the resister 15, and the resultant voltage is output to an output terminal 18.

Assuming here that the resistance value of the resister 15 is set to an arbitrary value, the voltage at the output terminal 18 changes depending on the resistance value of the TMR element connection body 3 or that of the TMR element connection body 4; therefore, the failure can be detected by measuring this voltage change by the failure detector 12.

A switch or switches are used in Embodiments 1 to 3; however, when the circuit is formed on, for example, a bipolar IC, switching circuits are sometimes difficult to be formed on that. The configuration of Embodiment 4 is effective when forming of such switches is difficult.

As described above, a magnetic detection device according to Embodiment 4 of the present invention uses an amplifier and the current value flowing through the magnetoresistance elements is thereby converted into a voltage; therefore, even if the same number of connecting units fails in each of the TMR element connection bodies 3 and 4, the failure can be detected.

Embodiment 5

Figure 5:
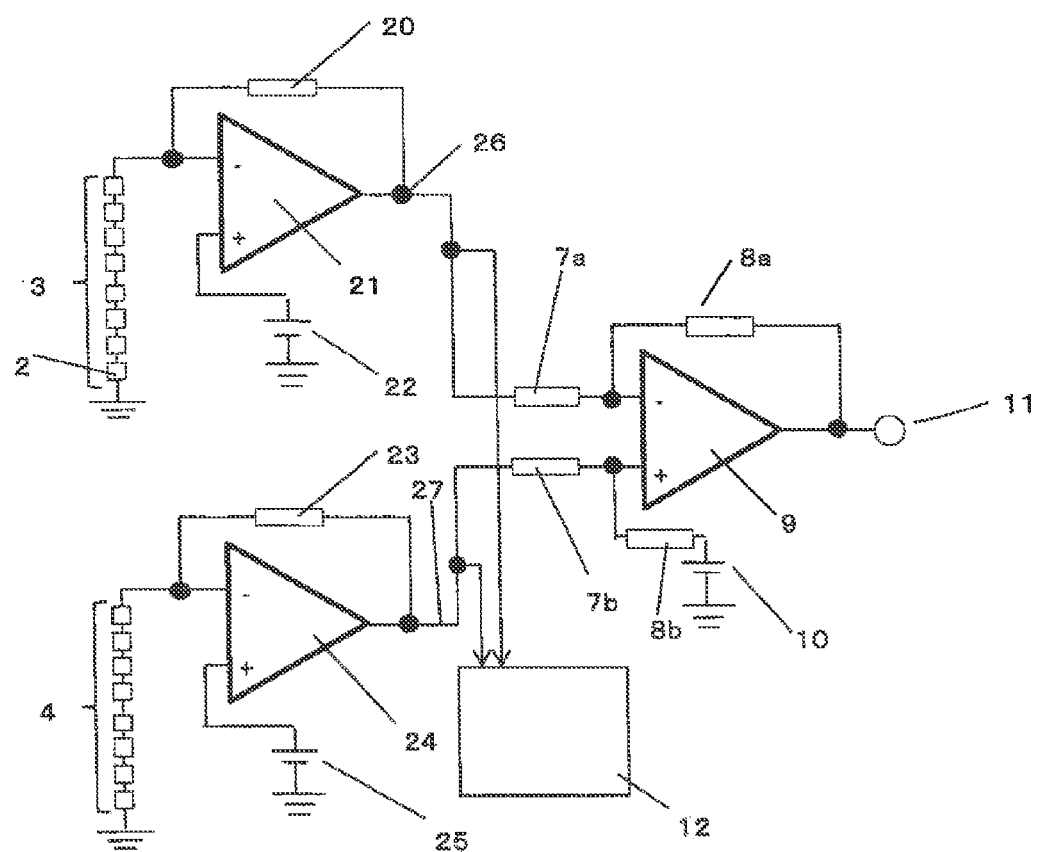
FIG. 5 is a circuit configuration diagram of a magnetic detection device according to Embodiment 5 of the present Invention.

FIG. 5 is a circuit configuration diagram showing a magnetic detection device according to Embodiment 5 of the present invention.

In FIG. 5, the reference numeral 2 represents a connecting unit of one TMR element; the TMR element connection bodies 3 and 4 each include as one set eight connecting units thereof. A current-voltage converter circuit is formed of resister 20, an operational amplifier 21 and a reference power supply 22, while another current-voltage circuit is similarly formed of a resister 23, an operational amplifier 24 and a reference power supply 25. Resisters 7a, 7b, 8a and 8b, the operational amplifier 9 and the reference power supply 10 constitute a differential amplifier. The reference numeral 12 represents a failure detector, which is connected to outputs 26 and 27 that are the outputs of the operational amplifiers 21 and 24, respectively.

Figure 6:
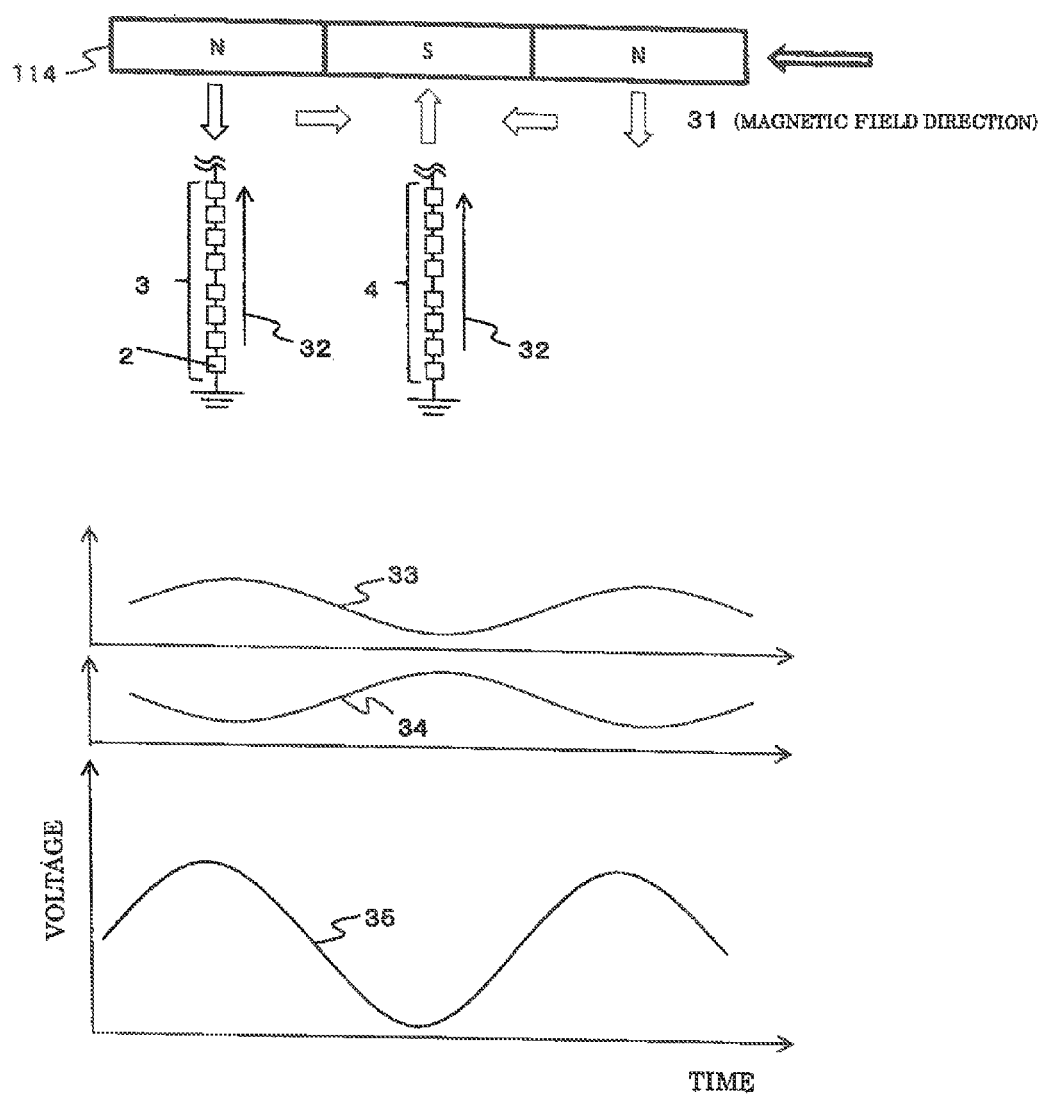
FIG. 6 is a waveform diagram for explaining operation of the magnetic detection device according to Embodiment of the present invention.
Figure 7:
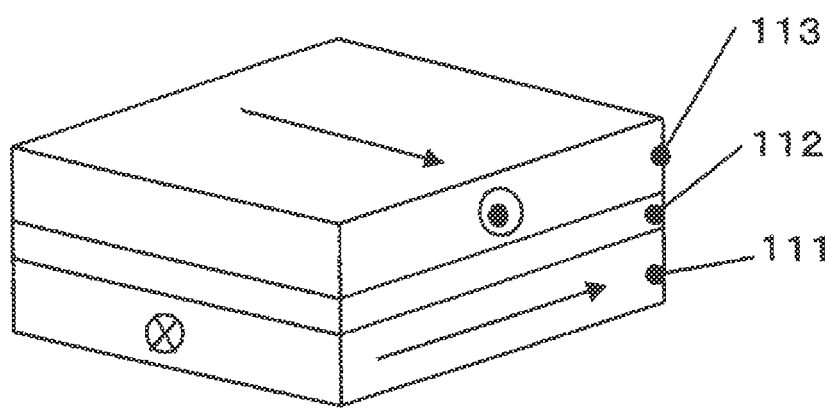
FIG. 7 is a perspective view showing the structure of a conventional magnetoresistance element.
Figure 8:
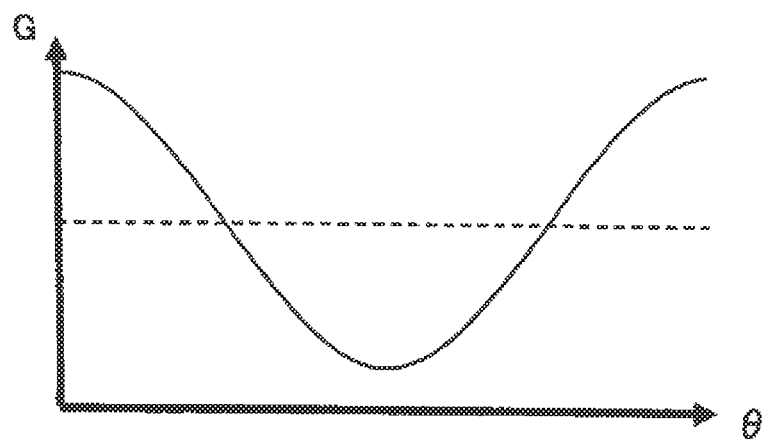
FIG. 8 is a waveform diagram for explaining the operational characteristics of the conventional magnetoresistance element.
Figure 8:
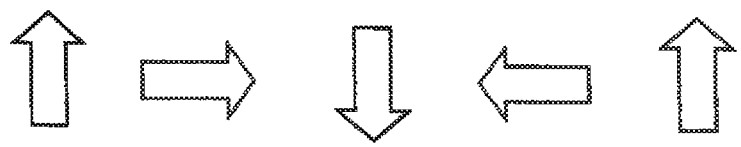

FIG. 6 is a diagram for explaining operation of Embodiment 5. One end of the TMR element connection body 3 is connected to the negative side of the operational amplifier 21 forming one of the current-voltage converter circuits. Since the positive side and the negative side of the operational amplifier 21 are imaginary shortcircuited with each other, the voltage of the reference power supply 22 is applied to the TMR element connection body 3. The TMR element connection body 4 is also configured similarly, so the voltage of the reference power supply 25 is applied to the TMR element connection body 4. When the magnet body 114 disposed in front of the TMR element connection bodies 3 and 4 moves in the left direction on this paper, the direction 31 of an external magnetic field changes depending on the position as shown in the figure; therefore, the conductance G of each of the TMR element connection bodies 3 and 4 changes as explained in the conventional technology.

Letting the voltage of the reference power supplies 22 and 25 be VA, currents flowing through the TMR element connection bodies 3 and 4 are given from above-described Equation (1) as follows:

$$(G0+G1 \cos \theta)VA, \quad (3)$$

$$(G0+G1 \cos(\theta+\pi))VA. \quad (4)$$

Waveforms at the outputs 26 and 27 of their respective operational amplifiers 21 and 24 forming the current-voltage converter circuits become in the form of a cosine wave as shown by the waveforms 33 and 34 in FIG. 6.

The outputs 26 and 27 of the operational amplifiers 21 and 24, respectively, are input to the operational amplifier 9 constituting the differential amplifier. The input waveforms are amplified by the differential amplifier 9, so the waveform at the output terminal 11 becomes in the form of a cosine wave represented by the reference numeral 35 in FIG. 6; therefore, the movement of the magnet body, which is an object to be detected, can be detected.

In order to detect failure of the TMR elements, assume here that a magnetic field in the same direction 32 is applied to the magnetization fixed layers of all the TMR elements of the TMR element connection bodies 3 and 4. This is because the TMR element connection bodies 3 and 4 are made to show a predetermined resistance value. One end of the TMR element connection body 3 and that of the TMR element connection body are connected to the operational amplifier 21 and the operational amplifier 24, respectively, which form the current-voltage converter circuits. Assuming that the resistance value of each of the resisters 20 and 23 is set to an arbitrary value, the voltage of the output 26 or 27 changes depending on the resistance value of the TMR element connection body 3 or 4, respectively; therefore, the failure can be detected by measuring this voltage change by the failure detector 12.

As described in Embodiment 4, when the circuit is formed on, for example, a bipolar IC, forming switching circuits is sometimes difficult; however, the configuration of Embodiment 5 will be effective when forming of such switches is difficult.

As described above, a magnetic detection device according to Embodiment 5 of the present invention uses amplifiers and the current values flowing through magnetoresistance elements are converted into their respective voltages; therefore, even if the same number of connecting units fails in each of the TMR element connection bodies 3 and 4, the failure can be detected.

Additionally, explanations have been made in the above-described embodiments, using as magnetoresistance elements tunnel magnetoresistance elements; however, this invention can be embodied in the same manner using giant magnetoresistance elements.

Furthermore, the embodiments of this invention can be suitably modified or deleted within the scope of the invention.

INDUSTRIAL APPLICABILITY

The present invention relates to a magnetic detection device that uses magnetoresistance elements and detects rotation of an object to be detected by change in magnetic field, so the device can be preferably used for a rotation sensor that detects rotation of a crank shaft or a cum shaft of a vehicle engine.

DESCRIPTION OF THE REFERENCE NUMERALS

1: switch, 2: connecting unit of one TMR element, 3, 4: TMR element connection body, 5: power supply, 6: midpoint of bridge, 7, 8: resister, 9: operational amplifier (amplifier), 10: reference power supply, 11: output terminal, 12: failure detector, 13a, 13b, 14: switch, 15: resister, 16: operational amplifier, 17: power supply, 18: output terminal, 19: buffer, 20: resister, 21: operational amplifier, 22: reference power supply, 23: resister, 24: operational amplifier, 25: reference power supply

The invention claimed is:
1. A magnetic detection device comprising:
a first element and a second element that are magnetoresistance elements whose resistance value changes in response to an external magnetic field and which are connected in series with each other to form a bridge circuit having one end connected to a power supply and another end grounded;
a connecting point between the first element and the second element that is connected to an amplifier; and
a switch connected in series with the bridge circuit,
wherein the switch includes a first contact and a second contact,
wherein, in the switch, the first contact is configured to be open when the second contact is closed, and the second contact is configured to be open when the first contact is closed,
wherein the first contact is configured to connect the bridge circuit to the power supply when the first contact is closed, wherein the second contact is configured to connect the bridge circuit to a ground when the second contact is closed, and wherein an output of the amplifier is connected to a failure detector which, when the second contact of the switch is connected to the ground, is configured to measure a voltage value at the output of the amplifier and detect a failure in at least one among the first element and the second element based on the measured voltage value.

2. The magnetic detection device according to claim 1, wherein each of the magnetoresistance elements includes:
a magnetization fixed layer whose magnetization direction is fixed with respect to the external magnetic field,
a magnetization free layer whose magnetization direction rotates in response to the external magnetic field, and
a non-magnetic intermediate layer that is sandwiched between the magnetization fixed layer and the magnetization free layer.

3. The magnetic detection device according to claim 1, wherein each of the magnetoresistance elements includes a tunnel magnetoresistance (TMR) element.

4. A magnetic detection device comprising:
a first element and a second element that are magnetoresistance elements whose resistance value changes in response to an external magnetic field and which are connected in series with each other; and
a third element and a fourth element that are the magnetoresistance elements and are connected in series with each other,
wherein the first element, the second element, the third element, and the fourth element form a bridge circuit,
one end of the bridge circuit is connected to a power supply,
other end of the bridge circuit is grounded,
a first connecting point between the first element and the second element and a second connecting point between the third element and the fourth element are both connected to an amplifier,
a first switch is connected in series with the bridge circuit, and includes a first contact and a second contact, wherein the first contact is configured to be open when the second contact is closed, and the second contact is configured to be open when the first contact is closed,
a second switch is connected between the bridge circuit and the amplifier, and includes a third contact and a fourth contact, wherein the third contact is configured to be open when the fourth contact is closed, and the fourth contact is configured to be open when the third contact is closed,
the first contact and the third contact are configured to connect the bridge circuit and a first input of the amplifier to the power supply when the first contact and the third contact are closed, respectively,
the second contact and the fourth contact are configured to connect the bridge circuit and a second input of the amplifier to a ground when the second contact and the fourth contact are closed, respectively, and
an output of the amplifier is connected to a failure detector, which, when the second contact of the first switch and the fourth contact of the second switch are connected to the ground, is configured to measure a voltage value at the output of the amplifier and detect a failure in at least one among the first element and the second element based on the measured voltage value.

5. The magnetic detection device according to claim 4, wherein each of the magnetoresistance elements includes:
a magnetization fixed layer whose magnetization direction is fixed with respect to the external magnetic field,
a magnetization free layer whose magnetization direction rotates in response to the external magnetic field, and
a non-magnetic intermediate layer that is sandwiched between the magnetization fixed layer and the magnetization free layer.

6. The magnetic detection device according to claim 4, wherein each of the magnetoresistance elements includes a tunnel magnetoresistance (TMR) element.

7. A magnetic detection device comprising:
a first element and a second element that are magnetoresistance elements whose resistance value changes in response to an external magnetic field and which are connected in series with each other to form a bridge circuit having one end connected to a power supply via a first amplifier and another end grounded;
a connecting point between the first element and the second element that is connected to a second amplifier via a buffer; and
a resistor having one end connected between the power supply and the one end of the bridge circuit and another end connected to a failure detector,
wherein, in a case of a failure, the buffer is configured to block a current from the first and second elements, and the failure detector is configured to detect the failure in at least one among the first element and the second element based on the current flowing through the resistor from the first and second elements.

8. The magnetic detection device according to claim 7, wherein each of the magnetoresistance elements includes:
a magnetization fixed layer whose magnetization direction is fixed with respect to the external magnetic field,
a magnetization free layer whose magnetization direction rotates in response to the external magnetic field, and
a non-magnetic intermediate layer that is sandwiched between the magnetization fixed layer and the magnetization free layer.

9. The magnetic detection device according to claim 7, wherein each of the magnetoresistance elements includes a tunnel magnetoresistance (TMR) element.

10. A magnetic detection device comprising magnetoresistance elements including a first element and a second element, each of the first element and the second element including:
a magnetization fixed layer whose magnetization direction is fixed with respect to an external magnetic field;
a magnetization free layer whose magnetization direction rotates in response to the external magnetic field; and
a non-magnetic intermediate layer that is sandwiched between the magnetization fixed layer and the magnetization free layer,
wherein one end of the first element is connected to a first power supply via a first amplifier, and another end of the first element is grounded,
one end of the second element is connected to a second power supply via a second amplifier, and another end of the second element is grounded,
a first resistor has one end connected between the one end of the first element and the first power supply, and another end connected to a third amplifier and to a first failure detector configured to detect a failure in the first element based on a first current flowing through the first resistor from the first element, and
a second resistor has one end connected between the one end of the second element and the second power supply, and another end connected to the third amplifier and a second failure detector configured to detect a failure in the second element based on a second current flowing through the second resistor from the second element.

11. The magnetic detection device according to claim 10, wherein the third amplifier includes a differential amplifier.

12. The magnetic detection device according to claim 10, wherein each of the magnetoresistance elements includes a tunnel magnetoresistance (TMR) element.

* * * * *